(12) United States Patent
Li et al.

(10) Patent No.: US 12,106,820 B2
(45) Date of Patent: Oct. 1, 2024

(54) SINGLE COLUMN SELECT ARCHITECTURE FOR SENSE AMPLIFIER CIRCUITY

(71) Applicant: Micron Technology, Inc., Boise, ID (US)

(72) Inventors: Luoqi Li, Meridian, ID (US); Huy Thanh Vo, Boise, ID (US); Christopher John Kawamura, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 204 days.

(21) Appl. No.: 17/975,300

(22) Filed: Oct. 27, 2022

(65) Prior Publication Data

US 2024/0144983 A1   May 2, 2024

(51) Int. Cl.
| | |
|---|---|
| *G11C 7/22* | (2006.01) |
| *G11C 7/06* | (2006.01) |
| *G11C 7/10* | (2006.01) |
| *G11C 7/12* | (2006.01) |

(52) U.S. Cl.
CPC ............... *G11C 7/1063* (2013.01); *G11C 7/06* (2013.01); *G11C 7/1069* (2013.01); *G11C 7/12* (2013.01)

(58) Field of Classification Search
CPC ....... G11C 7/1063; G11C 7/06; G11C 7/1069; G11C 7/12
USPC .................................................. 365/189.011
See application file for complete search history.

(56) References Cited

U.S. PATENT DOCUMENTS

| | | | | | |
|---|---|---|---|---|---|
| 6,104,653 | A | * | 8/2000 | Proebsting | G11C 8/08 257/E21.659 |
| 6,320,806 | B1 | * | 11/2001 | Han | G11C 7/1048 365/189.11 |
| 6,956,780 | B2 | * | 10/2005 | Kyung | G11C 7/1069 365/205 |
| 8,576,647 | B2 | * | 11/2013 | Yamada | G11C 29/025 365/201 |
| 8,675,422 | B2 | * | 3/2014 | Furutani | G11C 11/4074 365/189.07 |
| 8,737,152 | B2 | * | 5/2014 | Kim | G11C 7/12 365/201 |
| 8,872,258 | B2 | * | 10/2014 | Yoshida | G11C 11/4091 257/329 |
| 8,873,272 | B2 | * | 10/2014 | Lee | G11C 29/1201 365/148 |
| 9,053,760 | B2 | * | 6/2015 | Miyatake | G11C 7/065 |
| 9,520,177 | B2 | * | 12/2016 | Matsumoto | G11C 11/4097 |
| 10,672,435 | B2 | * | 6/2020 | Ingalls | G11C 5/025 |
| 11,621,027 | B2 | * | 4/2023 | Ong | G11C 11/1675 365/158 |
| 11,727,980 | B2 | * | 8/2023 | He | G11C 11/4074 365/185.21 |

(Continued)

*Primary Examiner* — Viet Q Nguyen
(74) *Attorney, Agent, or Firm* — Fletcher Yoder, P.C.

(57) ABSTRACT

An apparatus may include a sense amplifier with a single column select transistor, a local input/output line selectively couplable to a first bit line through the column select transistor, and a read/write gap comprising at least a first transistor and a second transistor. The first transistor may be couplable to a read select signal and a complimentary local input/output line and the second transistor is couplable to the complimentary local input/output line and a global input/output line.

21 Claims, 10 Drawing Sheets

(56) References Cited

U.S. PATENT DOCUMENTS

2014/0140124 A1\* 5/2014 Kang .................. G11C 13/004
　　　　　　　　　　　　　　　　　　　　　365/158
2022/0319576 A1\* 10/2022 He ..................... G11C 11/4091

\* cited by examiner

SINGLE COLUMN SELECT ARCHITECTURE FOR SENSE AMPLIFIER CIRCUITY

BACKGROUND

Field of the Invention

Embodiments of the present disclosure relate generally to the field of semiconductor devices. More specifically, embodiments of the present disclosure relate to sense amplifier circuitry with one column select transistor to enable higher array efficiency and improved performance of the semiconductor device.

Description of the Related Art

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light and not as admissions of prior art.

Electronic devices, such as semiconductor devices, memory chips, microprocessor chips, image chips, and the like, may include a plurality of memory banks, each with a memory cell array that performs operations (e.g., read, write, or store data) for the electronic device. The electronic device may receive signals having varying voltage levels during operation. A sense amplifier may be coupled to memory cells of the memory cell array to detect a charge associated with a bit stored in the memory cell. However, due to a large number of sense amplifiers in the electronic device, excess consumption of resources (e.g., power and/or area) by the sense amplifier may impact the efficiency of the electronic device's resources.

Further, electronic devices are being scaled smaller. As such, array efficiency may be limited by the large number of sense amplifiers in the memory cell array. That is, sense amplifiers are generally large, and therefore occupy valuable real estate that may otherwise be used for storage components within the memory cell array. As such, there is a need for memory cell arrays with reduced size and increased array efficiency (AE).

Embodiments of the present disclosure may be directed to address one or more of the problems set forth above.

BRIEF DESCRIPTION OF THE DRAWINGS

Various aspects of this disclosure may be better understood upon reading the following detailed description and upon reference to the drawings in which.

DETAILED DESCRIPTION

Figure 1:
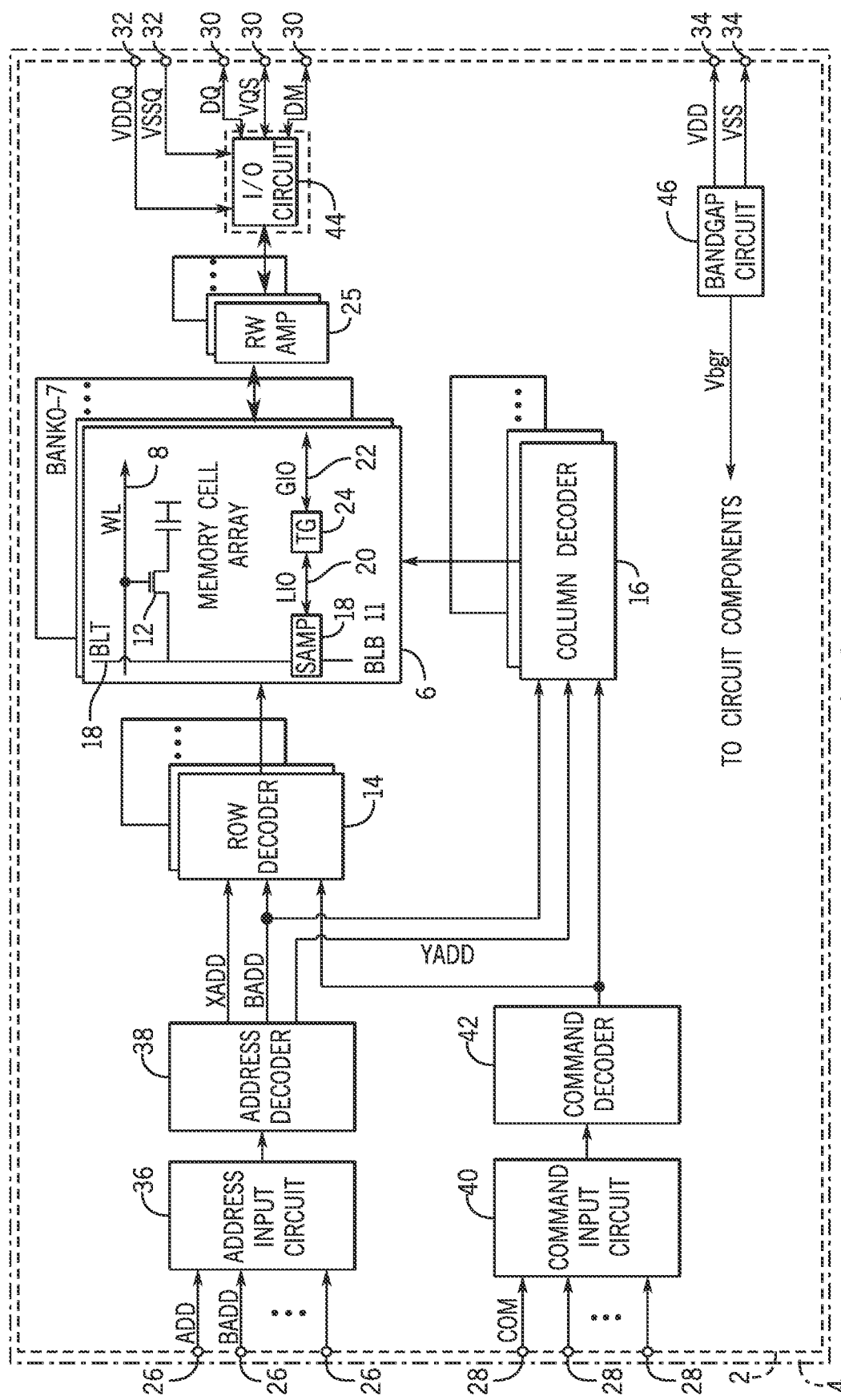
FIG. 1 is a simplified block diagram illustrating certain features of a semiconductor device including sense amplifiers with one column select gate, according to an embodiment of the disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Memory devices may include a memory array which includes a number of memory cells, each of which may store information. For example, each memory cell may store a single bit of information as a logic high ("1") or a logic low ("0"). The memory cells may be located at the intersections of word lines (rows) and bit lines (columns). Each word line may be associated with a row address, and each bit line may be associated with a column address. Accordingly, memory cells may be specified by their row and column addresses. When a memory cell is accessed (e.g., a read or write operation), the memory cell may be coupled via the bit line to a sense amplifier. For example, in a read operation, the value stored in the memory cell (e.g., as a capacitive charge) may change a voltage of the bit line. The sense amplifier may detect this change, amplify the voltage to a system level (e.g., a voltage which represents logic high or a voltage which represents logic low) and then provide those voltages along a local input/output (LIO) and global input/output (GIO) to read/write amplifiers, which in turn may send the voltage to data terminals of the memory. During an example write operation, the process may be generally reversed (e.g., from GIO to LIO, to sense amplifier to bit line to memory cell).

In conventional memory devices, the sense amplifier, local input/output (LIO) lines, and global input/output (GIO) lines may use a complimentary, double-ended architecture. In the double-ended architecture, the sense amplifier may be coupled to a first bit line, which is coupled to the accessed memory cell, and a second bit line. The second bit line may have a value which is complimentary to the value of the first bit line. However, additional signal lines (e.g., complimentary LIO, complimentary GIO) and the transistors needed to operate the second bit line may take up additional space on the memory device. Furthermore, components within a sense amplifier may operate in pairs to implement the double-ended architecture. For example, the sense amplifier may include a first column select transistor coupled to the LIO and bit line and a second column select transistor coupled to a complimentary LIO and the second bit line. Accordingly, the memory device may include hundreds or thousands of sense amplifiers which may impact array efficiency of the memory device.

The present disclosure is directed to systems and methods for a sense amplifier with one column select transistor. For example, the sense amplifier may include one column select transistor coupled to the LIO and the accessed memory cell via the bit line. Removing a column select transistor from prior architectures may reduce a size of the sense amplifier and improve array efficiency. During an example read operation, the sense amplifier may drive the first bit line and the second bit line to complimentary voltages, but only one voltage is coupled to the LIO and the GIO. During an example write operation, a voltage may be provided along the GIO and the LIO, and the sense amplifier may drive the voltages of the first bit line and the second bit line based on the voltage of the LIO. The present disclosure may also relate to read/write circuits and minigap circuits, and methods of operating the read/write circuits and the minigap circuits in conjunction with the single column select transistor of a single-ended LIO/GIO architecture which may reduce voltage leakage and improve performance of the memory device.

With the foregoing in mind, FIG. 1 is a block diagram of a semiconductor device including a sense amplifier with one column gate transistor, in accordance with an embodiment of the present invention. That is, for example, the semiconductor device 2 may include a memory cell array coupled to a sense amplifier with one column select transistor to improve array efficiency. Although the following description of the semiconductor device 2 and the memory cell array will be described in the context of a memory device, it should be noted that the embodiments described herein regarding the memory cell array coupled to sense amplifier circuitry with one column select transistor may be employed for any suitable electronic device. Indeed, the description of the memory device below is provided to explain certain aspects of the memory cell array including sensing circuitry with one column select transistor, associated read/write gap, and minigap circuitry of the present disclosure, and, as such, the embodiments described herein should not be limited to memory devices.

Referring now to FIG. 1, a semiconductor device 2 may be any suitable memory device, such as a low power double data rate type 4 (LPDDR4) synchronous dynamic random access memory (SDRAM) integrated into a single semiconductor chip, for example. A plurality of semiconductor devices 2 (e.g., ×4, ×8 or ×16) may be mounted on an external substrate 4 that is a memory module substrate, such as a dual inline memory module (DIMM), a mother board or the like. The semiconductor device 2 may include a plurality of memory banks BANK0-7 (e.g., 8, 16 or 32) each having a memory cell array 6. The memory cell array 6 may include word lines (WL) 8, bit lines (BLT) 10, complimentary bit lines (BLB) 11, and a number of memory cells (MC) 12 arranged at intersections of the plurality of WL 8 and BLT 10. The selection of the WL 8 is performed by a row decoder 14 and the selection of the BLTs 10 is performed by a column decoder 16. Sense amplifiers (SAMP) 18 are coupled to corresponding BLTs 10 and BLBs 11, and connected to local input/output (I/O) lines 20. The LIO (LIO) lines 20 are connected to global IO (GIO) lines 22 via transfer gates (TG) 24 which function as switches. The TG 24 may be a transistor (e.g., MOSFET gate) or circuitry configured to transition between the GIO lines 22 and the LIO lines 20. For example, as further described herein, the TG 24 may include read/write circuitry and minigap circuitry. During a read operation, read data from the BLTs 10 or BLBs 11 is amplified by a respective SAMP 18 and transferred to the read/write (RW) amplifiers 25 over the LIO 20 and the GIO 22 via the TG 24. During a write operation, write data outputted from the RW amplifiers 25 is transferred to the SAMP 18 over the GIO 22, the TG 24, the LIO 20, and written into the MC 12 coupled to the BLT 10 or BLB 11.

Turning to the explanation of a plurality of external terminals included in the semiconductor device 2, the plurality of external terminals includes address terminals 26, command terminals 28, data strobe (DQS) and data (DQ) terminals 30 and power supply terminals 32 and 34. The data terminals 30 may be coupled to output buffers for read operations of memories. Alternatively, the data terminals 30 may be coupled to input buffers for read or write access of the memories.

The address terminals 26 are supplied with an address signal ADD and a bank address signal BADD. The address signal ADD and the bank address signal BADD supplied to the address terminals 26 are transferred via an address input circuit 36 to an address decoder 38. The address decoder 38 receives the address signal ADD and supplies a decoded row address signal XADD to the row decoder 14, and a decoded column address signal YADD to the column decoder 16. The address decoder 38 also receives the bank address signal BADD and supplies the bank address signal BADD to the row decoder 14 and the column decoder 16.

The command terminals 28 are supplied with a command signal COM. The command signal COM may include one or more separate signals. The command signal COM input to the command terminals 28 is transferred via the command input circuit 40 to a command decoder 42. The command decoder 42 decodes the command signal COM to generate various internal command signals. For example, the internal commands may include a row command signal to select a word line and a column command signal, such as a read command or a write command, to select a bit line. In another example, the internal commands may include a sub-array signal to distinguish between the word lines and/or bit lines of a first sub-array and a second sub-array.

Although the address terminals 26 and the command terminals 28 are illustrated in FIG. 1 as being separate terminals, it should be noted that in some embodiments the address input circuit 36 and the command input circuit 40 may receive address signals ADD and command signals COM via one or more address and command terminals. That is, the address signals ADD and command signals COM may be provided to the semiconductor device 2 via the same terminal. For instance, the address and command terminals may provide an address signal at a falling clock edge (e.g., in synchronism with clock falling edge) and a command signal at a rising clock edge (e.g., in synchronism with clock rising edge). With this in mind, it should be understood that the description provided in the present disclosure with the separate address terminals 26 and command terminals 28 is included for discussion purposes and the techniques described herein should not be limited to using separate address terminals 26 and command terminals 28.

Accordingly, when a read command is issued and a row address and a column address are timely supplied with the read command, read data is read from a MC 12 in the memory cell array 6 designated by the row address and column address. The read data DQ is output externally from the data terminals 30 via the RW amplifier 25 and an input/output circuit 44. Similarly, when the write command is issued and a row address and a column address are timely supplied with the write command, and then write data DQ is supplied by the data terminals 30, the write data DQ is supplied via the input/output circuit 44 and the RW amplifier 25 to the memory cell array 6 and written in the MC 12 designated by the row address and the column address.

The input/output circuit 44 may include input buffers, according to one embodiment. The input/output circuit 44 receives external clock signals as a timing signal for determining input timing of write data DQ and output timing of read data DQ. Power supply potentials VDDQ and VSSQ are supplied to the input/output circuit 44. The power supply potentials VDDQ and VSSQ may be the same potentials as power supply potentials VDD and VSS that are supplied to power supply terminals 34, respectively. However, the dedicated power supply potentials VDDQ and VSSQ may be used for the input/output circuit 44 so that power supply noise generated by the input/output circuit 44 does not propagate to the other circuit blocks.

The power supply terminals 34 are supplied with power supply potentials VDD and VSS. These power supply potentials VDD and VSS are supplied to a bandgap circuit 46. In some embodiments, the bandgap circuit 46 may be a voltage reference circuit that outputs a constant (e.g., fixed) voltage independent of power supply variations, temperature changes, circuit loading, process variations, and the like.

The bandgap circuit 46 may, in some embodiments, generate various internal voltage potentials VPP, VOD, VARY, VBLP, VPERI, and the like to provide to various circuit components of the semiconductor device 2. For example, the internal voltage potential VPP may be mainly used in the row decoder 14, the internal potentials voltage VARY may be mainly used in the SAMPs 18 included in the memory cell array 6, and the internal potentials VARY, VBLP, and VPERI may be used in many other circuit blocks (e.g., TG 24).

Figure 2:
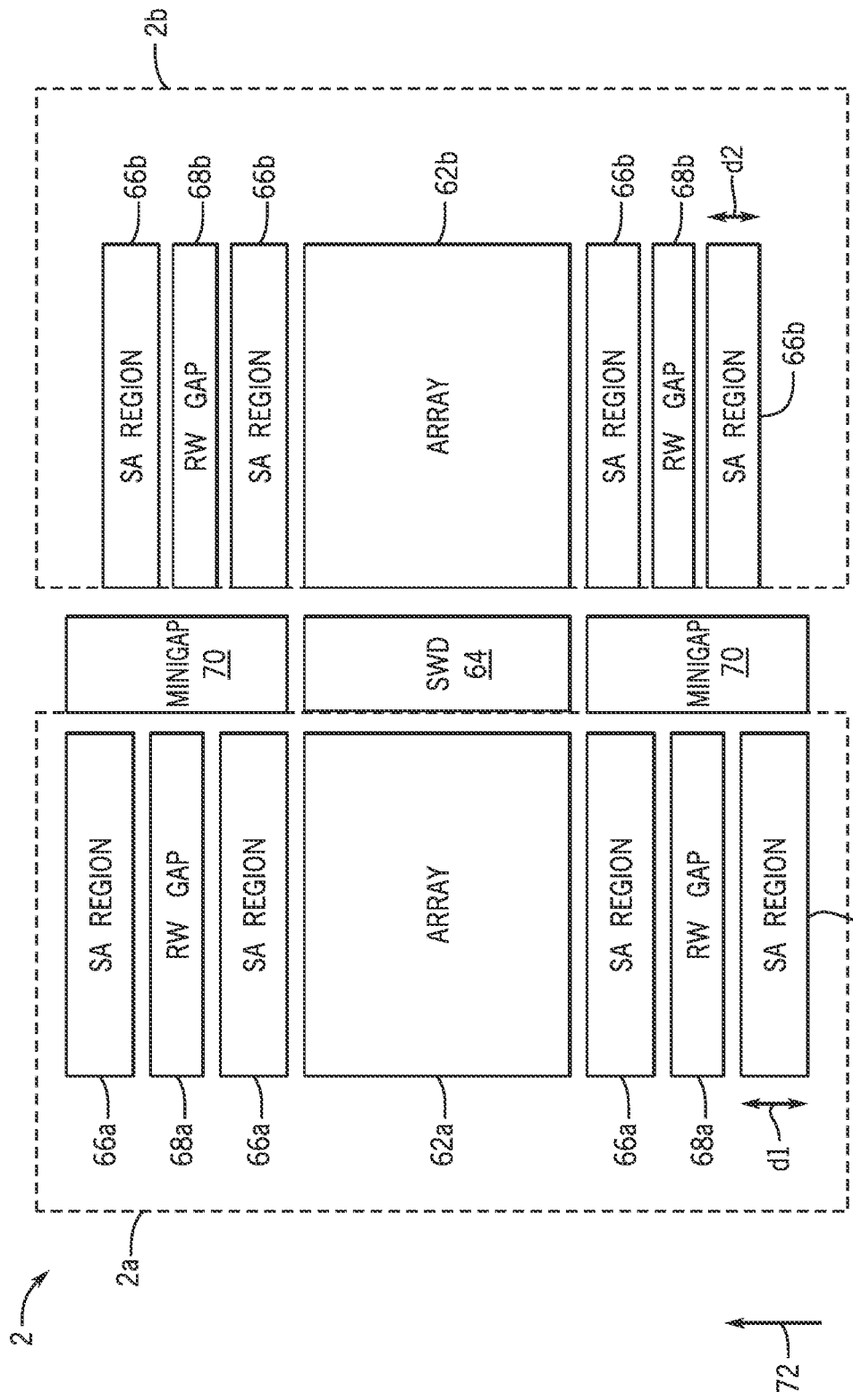
FIG. 2 is a block diagram of a portion of the semiconductor device of FIG. 1 including sense amplifiers with one column select gate, according to an embodiment of the disclosure.

FIG. 2 is a block diagram of an example layout comparing portions of semiconductor 2 including a conventional SAMP 18 with two column select transistors (semiconductor device 2a) and the SAMP 18 with one column select gate (semiconductor device 2b), which may be employed in place of the conventional portion of the semiconductor device 2a, in accordance with embodiments described herein. Each portion of the illustrated semiconductor device 2 (i.e., 2a and 2b) of the example layout described with respect to FIG. 2 may represent a portion of the memory cell array 6 coupled to the SAMP 18. That is, the components described with respect to FIG. 2 may be repeated (e.g., tiled) across the semiconductor 2. As such, FIG. 2 represents a simplified view of the components across the surface of the semiconductor device 2. Additional components not described with respect to FIG. 2 may also be present in the semiconductor 2. Thus, the relevant components of the semiconductor device 2 will be described generally below. Those skilled in the art will appreciate that in accordance with conventional semiconductor devices 2, the portion of the semiconductor device 2a may be utilized throughout the semiconductor device 2. In contrast in accordance with embodiments of the present invention, the portion of the semiconductor device 2b may be utilized throughout the semiconductor device 2.

As illustrated, the example layout includes an array region 62, sense amplifier (SA) regions 66, read/write (RW) gaps 68. The array region 62 includes WLs 8, BLTs 10, BLBs 11, and a number of memory cells MC 12 arranged at the intersection of the WLs 8 and the BLTs 10. The array regions 62 may be separated by a sub-word line driver (SWD) region 64. The SWD region 64 may include driver circuits which may activate the WLs 8 of the array region 62 as part of read or write operations. Circuitry within the SWD 64 may activate a WL 8 based on signals from a row decoder 14.

To active a BLT 10 or BLB 11, the semiconductor device 2 may include SA regions 66, which may include selection circuitry (e.g., SAMPs 18) to selectively couple to an MC 12, the BLT 10, and the LIO 20. The SAMPs 18 may receive a column select (CS) signal (e.g., from a column decoder 16) and couple the BLT 10 or BLB 11 to the LIO 20 for read or write operation. For example, to perform a read operation, the SAMP 18 may amplify a signal on the BLT 10 or BLB 11 within the array region 62. In another example, to perform a write operation, a signal may be transferred to the SAMP 18 from the GIO 22 via the LIO 20. Between two SA regions 66, the semiconductor 2 may include a read/write (RW) gap 68 to control timing and operation of the SAMPs 18 within the SA region 66. The RW gap 68 may include circuitry (e.g., TG 24) to selectively activate the SAMPs 18. Additionally or alternatively, the semiconductor device 2 may include a minigap 70. The minigap 70 may include circuitry (e.g., TG 24) to provide system level voltage potentials to various components (e.g., SA region 66, RW gap 68) of the semiconductor device 2. For example, the minigap 70 may include one or more transistors to control a voltage along the LIO 20 to pass a voltage to the SA region 66. For example, the minigap 70 may provide a system level voltage (e.g., a voltage which represents a logic high or a voltage which represents a logic low). In another example, the RW gap 68 and the minigap 70 may perform a local write and read operation and pass the signal to the GIO 22.

As illustrated on the left, in conventional semiconductor device 2a, the SA region 66a may have a width d1 in a y-direction 72. As further described with respect to FIG. 3, the SAMPs 18 in the conventional semiconductor 2a may include two column select (CS) transistors, which may occupy valuable real estate within the semiconductor device 2a. For example, the CS transistor may be located at a top edge (e.g., perpendicular to the y-direction 72) and a bottom edge of the SAMP 18. Having two CS transistors may increase the width of the SAMP 18 in the y-direction 72. Furthermore, additional signal lines may be used in combination with the two CS transistors, thereby occupying valuable real estate within the semiconductor device 2a.

Alternatively, as illustrated on the right, the semiconductor 2b may utilize an SAMP 18 with one CS transistor, in accordance with embodiments described herein. In this way, a size of the SA region 66b may be reduced in comparison to the size of the SA region 66a. The SA region 66b may have a width d2 in the y-direction 72. The width d2 may be smaller than the width d1 due to removing one CS transistor from each SAMP 18 used to support the array region 62b. By way of example, the SA region 66b may be reduced by approximately 0.44 micrometers (um) or more in comparison to the SA region 66a, thereby improving overall array efficiency by 0.6% or more. Furthermore, a size of the minigap 70 may be reduced based on the width d2 of the SA region 66b. Accordingly, the size of the semiconductor device 2b may be reduced compared to the convention semiconductor device 2a and array efficiency may be improved.

Figure 3:
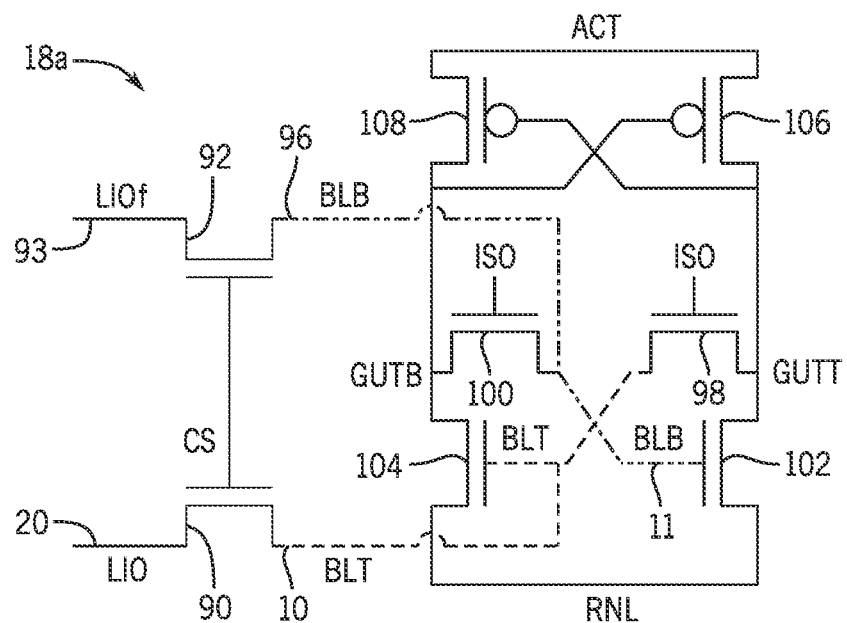
FIG. 3 is a circuit diagram of a sense amplifier with two column select gates.

With the foregoing in mind, FIG. 3 is a circuit diagram of a SAMP 18a, which may be a conventional SAMP, in accordance with conventional designs. In a conventional semiconductor device 2a (FIG. 2), the SAMP 18 may include a first CS transistor 90 with a node coupled to the LIO 20, a node coupled to the BLT 10, and a gate coupled to the CS signal, and a second CS transistor 92 coupled to a complimentary LIO (LIOf) 93 and the BLB 11. The CS transistors 90 and 92 may be n-type transistors. The LIOf 93 may have a complimentary value in comparison to the value of the LIO 20. For example, if a logic high is read from an accessed MC 12, the SAMP 18a may drive the BLT 10 to a first voltage which represents a logic high and the BLB 11 to a second voltage which represents a logic low. The voltages may be read along the LIO 20 and LIOf 93. However, as described herein and discussed in greater detail below, having two CS transistors 90 and 92 may take up valuable real estate on the semiconductor device 2b (FIG. 2), thereby reducing array efficiency.

The SAMP 18a includes a pair of isolation (ISO) transistors 98 and 100. The isolation transistors 98 and 100 may be coupled to respective ISO signals and operated independently from each other as part of a write operation. For example, the first ISO transistor 98 may be coupled to the BLT 10 and a node GUTT and the second ISO transistor 100 may be coupled to the BLB 11 and a node GUTB. The first ISO transistor 98 may act as a switch and couple the BLT 10 to the node GUTT when the ISO signal is received. Additionally or alternatively, the second ISO transistor 100 may couple the BLB 11 to the node GUTB when the ISO signal is received. The first ISO transistor 98 may first receive the ISO signal, then the second ISO transistor 100 may receive the ISO signal, thereby introducing complexity to the control scheme. For example, a timing difference between the first ISO transistor 98 receiving the signal and the second ISO transistor receiving the signal may result in leakage.

The SAMP 18a includes p-type transistors 102 and 104 and n-type transistors 106 and 108. The transistor 102 has a node coupled to a Row Nsense Latch (RNL) signal, a node coupled to the node GUTT, and a gate coupled to the BLB 11. The transistor 104 has a node coupled to the RNL signal, a node coupled to a node GUTB, and a gate coupled to the BLT 10. The transistor 106 has a node coupled to an ACT signal, a node coupled to the node GUTT, and a gate coupled to a node GUTB. The transistor 108 has a node coupled to the signal ACT, a node coupled to the node GUTB, and a gate coupled to the node GUTT. During read and write operations, the ACT signal and the RNL signal may be set to system voltages which represent a logic high and a logic low value, respectively.

Figure 4:
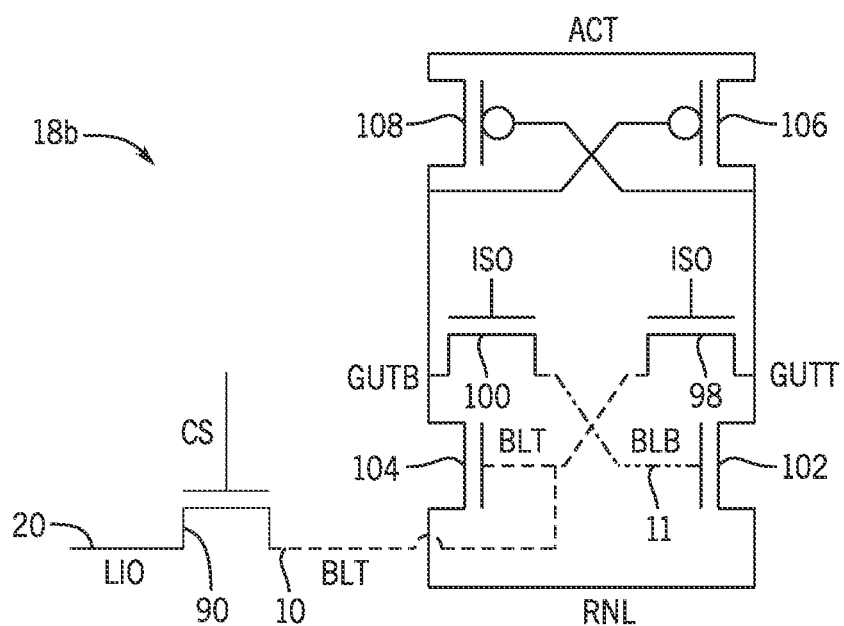
FIG. 4 is a circuit diagram of a sense amplifier with one column select gate, according an embodiment of the disclosure.

With the preceding in mind, FIG. 4 is a circuit diagram of the SAMP 18b, which may be a SAMP in accordance with the embodiments described herein, used as the SAMP 18 of FIG. 1 and having only one CS transistor 90 to improve array efficiency (AE). The circuit diagram of SAMP 18b is similar to the circuit diagram of SAMP 18a described with respect to FIG. 3, except the SAMP 18b includes only the first CS transistor 90 coupled to the LIO 20 and the BLT 10 rather than the first CS transistor 90 and the second CS transistor 92. In this way, a size of the SAMP 18b may be reduced and the width of the SA region 66b may also be reduced. Furthermore, the SAMP 18b may not be coupled to the BLB 11 and/or the LIOf 93, which may further reduce a size of the semiconductor device 2, in accordance with the present embodiments.

The one CS transistor 90 may receive a CS signal with a higher voltage for a write operation in comparison to the two CS transistors 90 and 92 described with respect to FIG. 3. The elevated voltage may improve speed and marginality of the write operation. Additionally or alternatively, the voltage on the CS transistor 90 for the write operation may be higher in comparison to the voltage on the CS transistor 90 for the read operation. Furthermore, the LIO 20 may be precharged with a voltage equivalent to the voltage VARY to improve stability of the SAMP 18 and tRCD margin for a read operation (e.g., read 0). For example, lowering a precharge voltage from VPERI to VARY may reduce LIO 20 flipping the SAMP 18b at CS firing, as will be described below.

Additionally or alternatively, both ISO transistors 98 and 100 may be pulsed off or pulsed on by the ISO signal. It may be beneficial to pulse off both ISO transistors 98 and 100 at a same time rather than individually controlling the ISO transistors 98 and 100. As such, the ISO signal may be pulsed off prior to a CS signal and pulsed back on prior to the CS signal finishing. In this way, complexity of the control scheme for the ISO transistors 98 and 100 may be reduced and potential risks in sensing performance caused by timing difference between the two ISO transistors 98 and 100 may be reduced or eliminated. Accordingly, performance of the ISO transistors 98 and 100 may be improved.

Figure 5:
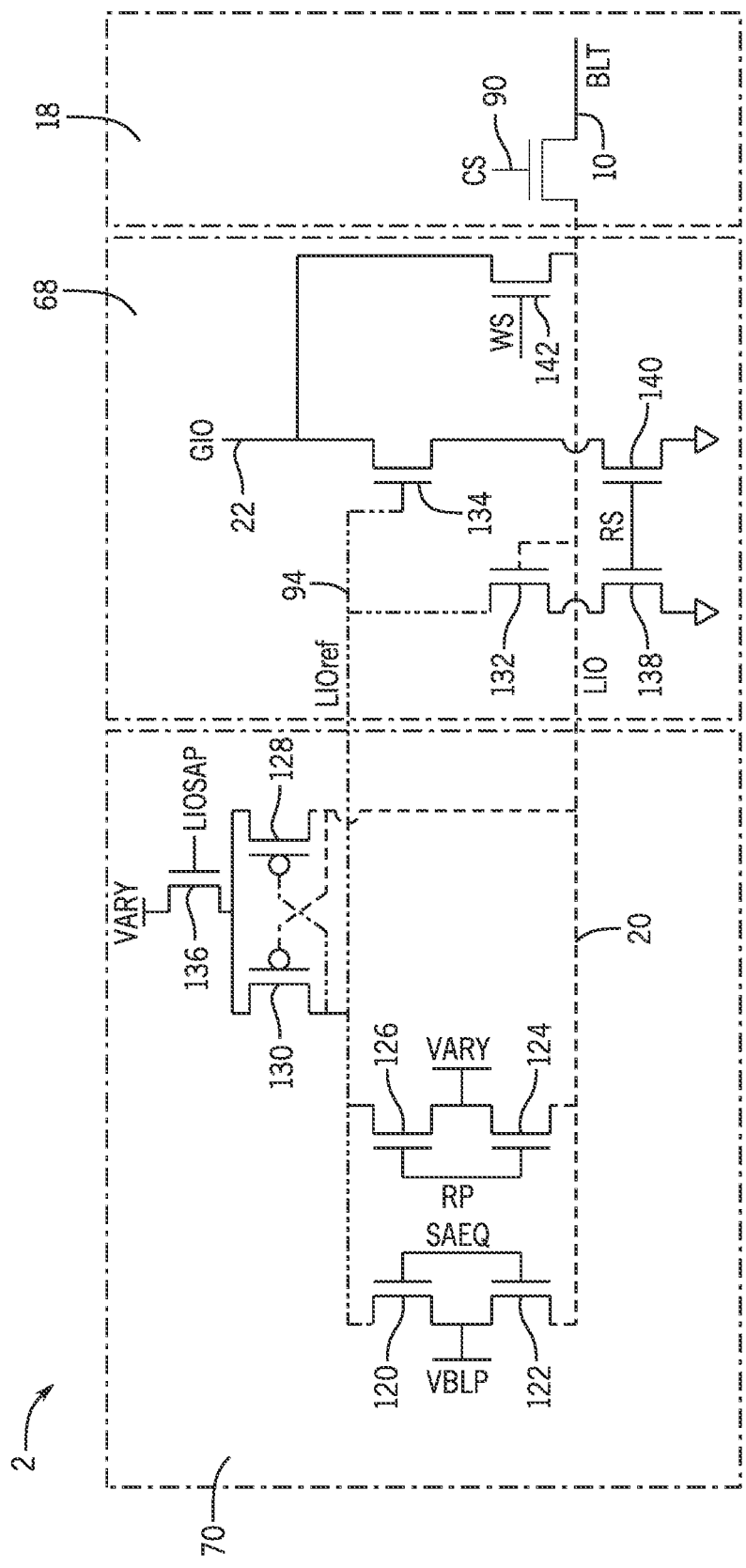
FIG. 5 is a circuit diagram of a portion of the semiconductor device of FIG. 1 with the sense amplifier with one column select gate, according to an embodiment of the disclosure.

FIG. 5 is a circuit diagram of a portion of the semiconductor device 2 including the SAMP 18 (e.g., SAMP 18b) with one CS transistor 90, the RW gap 68, and the minigap 70. The circuit diagram described with respect to FIG. 5 represents a simplified view in which many components may have been omitted. For example, in the SAMP 18b, one or more components have been omitted for the sake of clarify while explaining the signal which couples to the BLT 10 to the LIO 20. The circuit diagram also represents a specific division of components between different regions of the memory array 6, however other arrangements are possible in other example embodiments.

It may be understood that information read to and written from a BLT 10 may also be stored as a complimentary value to the BLB 11. As such, in certain embodiments, the LIO may be labeled as a complimentary line LIOf and the GIO may be labelled as a complimentary line GIOf. For example, the BLT may be coupled to the LIOf and GIOf and the naming convention may be used to indicate access operations by the SAMP 18, however these are merely naming conventions and other naming conventions may be used.

Returning to the minigap 70, the minigap 70 may include one or more transistors to control a voltage within the semiconductor device 2. As illustrated, the minigap 70 includes a transistor 120 with a node coupled to a LIO reference (LIOref) 94, a node coupled to a voltage VBLP, and a gate coupled to a SAEQ signal and a transistor 122 with a node coupled to the LIO 20, a node coupled to the voltage VBLP, and a gate coupled to the SAEQ signal. Accordingly, when the signal SAEQ is active, the transistors 120 and 122 may be active and the LIO 20 may be coupled to the voltage VBLP. The minigap 70 may also include a transistor 124 with a node coupled to the LIO 20, a node coupled to the system voltage VARY and a gate coupled to an RP signal and a transistor 126 with a node coupled to the LIOref 94, a node coupled to the system voltage VARY, and a gate coupled to the RP signal. Accordingly, when the RP signal is at a voltage representing a logic high (e.g., active), the transistors 124 and 126 may be active and may couple the LIO 20 or the LIOref 94 to the voltage VARY. The transistors 120, 122, 124, and 126 may be an n-type transistor.

Precharge and equilibrium may be added to the transistors 120 and 126 for stability and leakage control within the memory cell array 6. Before a read operation, the LIO 20 may be precharged to the voltage VARY. During row inactive time, the voltage on LIO 20 may be equivalent to the voltage VBLP and the CS signal may be inactive to reduce leakage. In certain instances, the LIO 20 may be precharged to VPERI, which may be a higher voltage in comparison to VARY. It may be understood that VPERI is an unregulated voltage and similar to an external voltage source (e.g., ~1.1 volts) and VARY is a regulated voltage similar to a cell high voltage (e.g., 0.96 volts). As such, lowering the precharge voltage to VARY may improve SAMP 18 stability and improve tRCD margin for read operations.

The minigap also includes a transistor 128 with a gate coupled to the LIOref 94 and a transistor 130 with a gate coupled to the LIO 20 to form a cross coupled configuration between the LIO 20 and the LIOref 94. The transistors may be p-type transistors. For example, the transistor 128 has a node coupled to the LIO 20 and a gate coupled to the LIOref 94 and the transistor 130 has a node coupled to the LIOref 94 and a gate coupled to the LIO 20. The cross coupled configuration may reduce current and improve performance during a read 1 operation.

The circuit diagram described with respect to FIG. 5 may be repeated across the semiconductor device 2. As such, the semiconductor 2 may include multiple LIOs 20 in parallel. By way of example, the semiconductor device 2 may include four LIOs 20 in parallel and coupling may occur between the LIOs 20 resulting in cross current through the transistor 130. During a read 1 operation, the LIO 20 is not strongly driven and the CS transistor 90 may have relatively low CS transistor voltage. A voltage on the LIO 20 may be coupled down several hundred millivolts (mVs) by neighboring LIOs, thereby driving the voltage on the LIOref 94 and causing the transistor 130 to be weakly on. However, the transistor 128 may pull up the voltage on the LIO 20 and cause the transistor 130 to remain inactive. For example, when the voltage on the LIOref 94 reaches a logic low, the voltage on the LIO 20 may be pulled up by transistor 128; as such the transistor 130 may be inactive and current may be reduced. Additionally or alternatively, the transistor 128 may be a p-type transistor and pull up the voltage on the LIOref 94 at faster than an n-type transistor. As such, the speed of the read 1 operation may be improved. By way of example, the semiconductor device 2 may have a passing speed grade equivalent to 8533 or better for LPDDR5 or DDR5.

When the voltage on LIOref 94 is at a logic high, the transistor 130 may couple the LIOSAP signal to transistors 132 and 134 in the RW gap 68. In which case, if the voltage on LIOref 94 is at logic low (e.g., at a ground voltage) then the transistor 130 may be inactive, and the GIO 22 may remain at a voltage representing a logic high (e.g., VARY). As such, the transistors 128 and 130 may act together as an inverter to invert the signal along the LIO 20 to the LIOref 94 when active (e.g., when the LIOSAP signal is high or on). When the voltage on the LIO 20 is at a logic low, the transistor 130 may be active, and the voltage VARY provided by transistor 136 may be provided to the LIOref 94 via the gate of the transistor 128. The transistor 132 may remain inactive, and the transistor 134 may be active (e.g., when RS signal is a logic high or on). That is, when voltage on the LIO 20 is at a logic high, the transistor 130 may be inactive. The transistors 132 and 138 may be active when the read select (RS) signal is a logic high or on, so the LIOref 94 may be coupled to a logic low. Additionally or alternatively, when the voltage on the LIO 20 is high but lower than the full logic high, the transistor 128 may be active after LIOref 94 is coupled to the logic low. As such, the logic high may be provided to the LIO 20 through the transistor 136. As such, the current through the transistors 130, 132, 136, and 138 can be reduced. The minigap 70 may also include a transistor 136 with a node coupled to the voltage source VARY, a node coupled to the node of the transistors 128 and 130, and a gate coupled to the LIOSAP signal. The transistor 136 may be an n-type transistor. Accordingly when the LIOSAP signal is at a logic high or on, the voltage VARY is coupled to the node of the transistor 136 (and potentially to the LIOref 94 if the voltage on the LIO 20 is a logic low).

The semiconductor device 2 may also include the RW gap 68 with transistors 132, 134, 138, 140, and 142. The RW gap 68 may be coupled to the SAMPs 18 with one CS transistor 90. The CS transistor 90 may be a transistor with a node coupled to the LIO 20, a node coupled to the BLT 10, and a gate coupled to the CS signal. The CS signal may be provided by a column decoder 16 at an active level when information along the BLT 10 is accessed. For example, the RW gap 68 may include transistors 138 and 140, which receive a read select (RS) signal, transistor 142, which receives a write select (WS) signal, and transistors 132 and 134, which couple to the minigap 70.

The transistors 138 and 140 may cause the SAMP 18 to perform a read operation. The transistors 138 and 140 may receive a read signal. For example, the transistor 138 may have a node coupled to the ground, a node coupled to the LIOref 94, and a gate coupled to the RS signal and the transistor 140 may have a node coupled to the ground, a node coupled to the transistor 134, and a gate coupled to the RS signal. In a conventional semiconductor device 2 (e.g., semiconductor device 2a), the transistor 140 may adjust a pull down strength for both the GIO 22 and the LIOf 93 is driven by the BLB 96 through the second CS transistor 92 described with respect to FIG. 3. The voltage on GIO 22 may be equivalent to the voltage VPERI which may be large in comparison to the voltage on LIOref 94. As such, leakage may occur. However, in the illustrated circuit diagram, the transistors 138 and 140 may be individually controlled to adjust a pull down strength for the GIO 22 and the LIOref 94. For example, the transistor 138 may adjust pull down strength for voltage on the LIOref 94 and the transistor 140 may adjust pull down strength for voltage on the GIO 22. The pull down on the GIO 22 may be greater than the pull down on the LIOref 94, thereby improving a speed of the read operation. Additionally or alternatively, individually controlling the pull down may reduce leakage from the LIOref 94 or the GIO 22. Indeed, voltage from the GIO 22 may be received by transistors 134 and 140 while voltage from the LIOref 94 may be received by the transistors 132 and 138. In this way, a read 0 operation and a read 1 operation may be balanced and leakage may be reduced.

In another example, the transistor 142 may receive a write select (WS) signal and cause the sense amplifier 18 to perform a write operation. For example, the transistor 142 may have a node coupled to the LIO 20, a node coupled to the GIO 22, and a gate coupled to the WS signal. When WS signal is active, the transistor 142 may be active and the GIO 22 may be coupled to the LIO 20. The CS transistor 90 may change a voltage of the BLT 10 and data may be written to an accessed MC 12 coupled to the BLT 10. The voltage on the CS transistor 90 (e.g., the voltage for the write operation) may be determined by the column decoder 16 and the voltage may be elevated to improve speed and marginality for the write operation. Further, to prevent leakage from GIO 22, the LIOSAP signal may be pulsed off during the write operation to keep the voltage VARY (from the transistor 136) and the voltage VPERI (from the GIO 22) separate. For example, pulsing off the LIOSAP signal may cause the transistor 136 to be inactive and prevent current from flowing on the LIO 20. As such, during a write 1 operation, potential leakage from the voltage VARY and the voltage VPERI may be reduced or eliminated.

Figure 6:
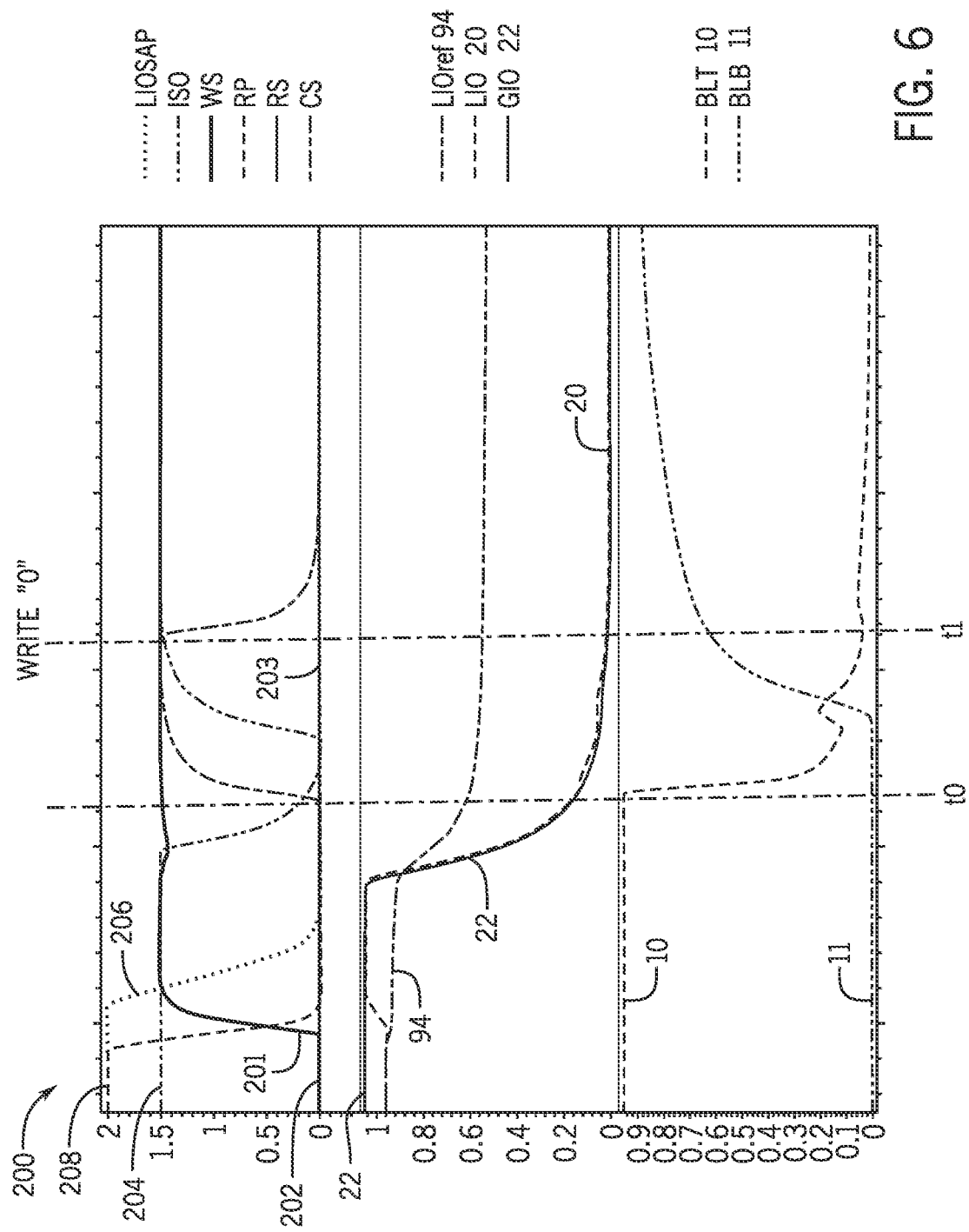
FIG. 6 is a graph illustrating an example logic low write operation of the semiconductor device of FIG. 1, according to an embodiment of the disclosure.
Figure 7:
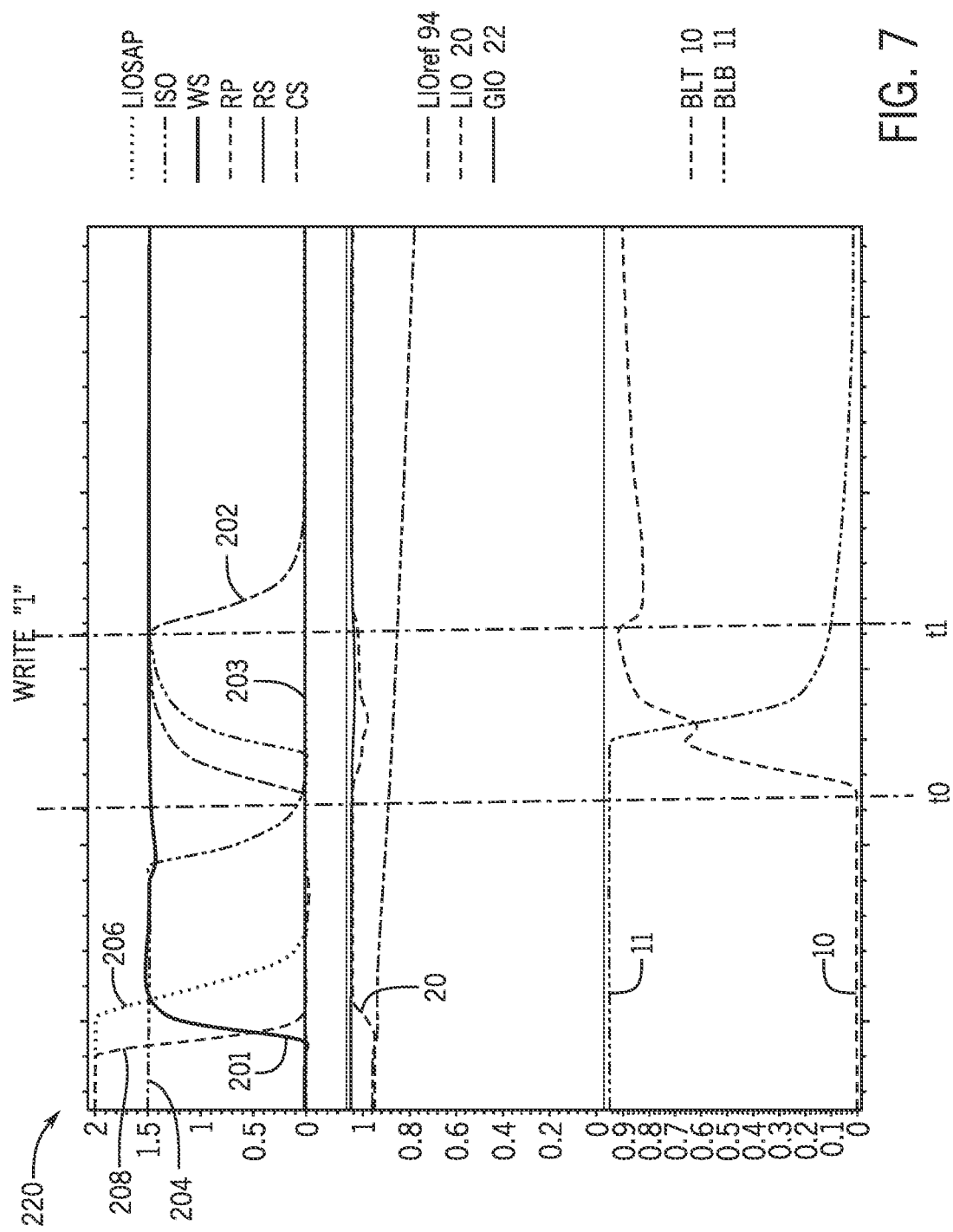
FIG. 7 is a graph illustrating an example logic high write operation of the semiconductor device of FIG. 1, according to an embodiment of the disclosure.

FIGS. 6 and 7 illustrate a graph of different control signals received by the SAMP 18b during write operations. For example, FIG. 6 illustrates a graph 200 illustrating control signals received the SAMP 18b during a write 0 operation. During the write 0 operation, a logic low is written to the BLT 10. Before an initial time t=t0, the voltage on the GIO 22 begins falling from a voltage which represents a logic high to a logic low. The WS signal 201 may be at a logic high, the CS signal 202 to the CS transistor 90 is at a logic high during the write operation, and the RS signal 203 may be at a logic low. At time t=t0, the CS signal 202 may begin to rise to a logic high. For example, the voltage of the CS signal 202 may be approximately 1.5V, which may be an elevated voltage in comparison to the voltage VARY. The ISO transistors 98 and 100 described with respect to FIG. 4 may receive an ISO signal 204. The ISO signal 204 may be pulsed off during the CS signal 202 to improve performance during the write operation. For example, at time t=t0, the ISO signal 204 may be pulsed off and pulsed on prior to the CS signal 202 shutting off at time t=t1. When the ISO signal 204 is inactive, the ISO transistors 98 and 100 may decouple the bit line BLT 10 from the gut node GUTT. Additionally or alternatively, the LIOSAP signal 206 and the RP signal 208 may drop from a logic high to a logic low. As such, the system voltage may represent a logic low.

The LIOSAP signal 206 may inactivate the transistor 136, which may decouple the LIOref 94 from the voltage VARY and the WS signal 201 may become active to couple the LIO 20 to the GIO 22 by activating the transistor 142. As such, the CS signal 202 may activate the CS transistor 90 and couple the LIO 20 to the BLT 10 and a logic low may be written to an associated MC 12. By controlling both ISO transistors 98 and 100 with one ISO signal, SAMP 18b performance may be improved and potential leakage may be reduced or eliminated. That is, controlling the ISO transistors 98 and 100 with different signals may result in a timing difference between the two ISO transistors 98 and 100 resulting in leakage.

Additionally or alternatively, the LIOSAP signal 206 may be pulsed off during the WS signal 201 and prior to the CS signal 202. Pulsing off the LIOSAP signal 206 may reduce leakage between GIO 22 and LIO 20. In other words, the current path along LIO 20 may be a logic high during the write operation, while the current path along GIO 22 may be inactive. As such, the LIOSAP signal 206 may be pulsed off to prevent voltage VARY to the voltage VPERI during the write operation.

At time t=t0, the voltage on BLT 10 begins to fall as the falling voltage on GIO 22 is coupled to the BLT 10 through the LIO 20. The falling voltage on BLT 10 may cause the transistor 104 to become inactive, which may decouple the node GUTB from the RNL signal (which may represent a voltage at logic low). The transistor 100 may couple the ACT signal (which may be set to a system voltage representing a logic high) which may couple the voltage on the BLB 11 to the node GUTB. As such, the voltage on the BLB 11 may rise to a logic high. Accordingly, a state of the bit lines BLT 10 and BLB 11 may switch and the logic low value may be written to the BLT 10 and a logic high value may be written to the BLB 11 at time t=t1.

FIG. 7 illustrates a graph 220 illustrating control signals received by the SAMP 18b for a write 1 operation. During a write 1 operation, a logic high is written to the BLT 10. Based on the control scheme, the graph 220 is substantially similar to the graph 200 described with respect to FIG. 6 except the voltages on the LIO 20, the GIO 22, and the LIOref 94 may be different as well as the voltages on the BLT 10 and the BLB 11. Prior to the initial time t=t0, the LIOSAP signal 206 and the RP signal 208 may become inactive. At time t=t0, the ISO signal 204 may be inactive and the CS signal 202 may be pulsed on. The ISO signal 204 may be pulsed off prior to the CS signal 202 and pulsed on prior to the CS signal 202 to improve the write performance. At time t=t1, the CS signal 202 may be pulsed off. The voltage on the GIO 22 and the LIO 20 may remain at a high voltage since a logic high is being written to the BLB 11. Accordingly, at time t=t0, the voltage on BLB 11 is at a logic high and the voltage on BLT 10 is at a logic low. At time t=t1, the voltage on BLB 11 is at a logic low and the voltage on BLT 10 is at a logic high, indicating that a high value has been written to the BLT 10 and a low value has been written to the BLB 11.

Figure 8:
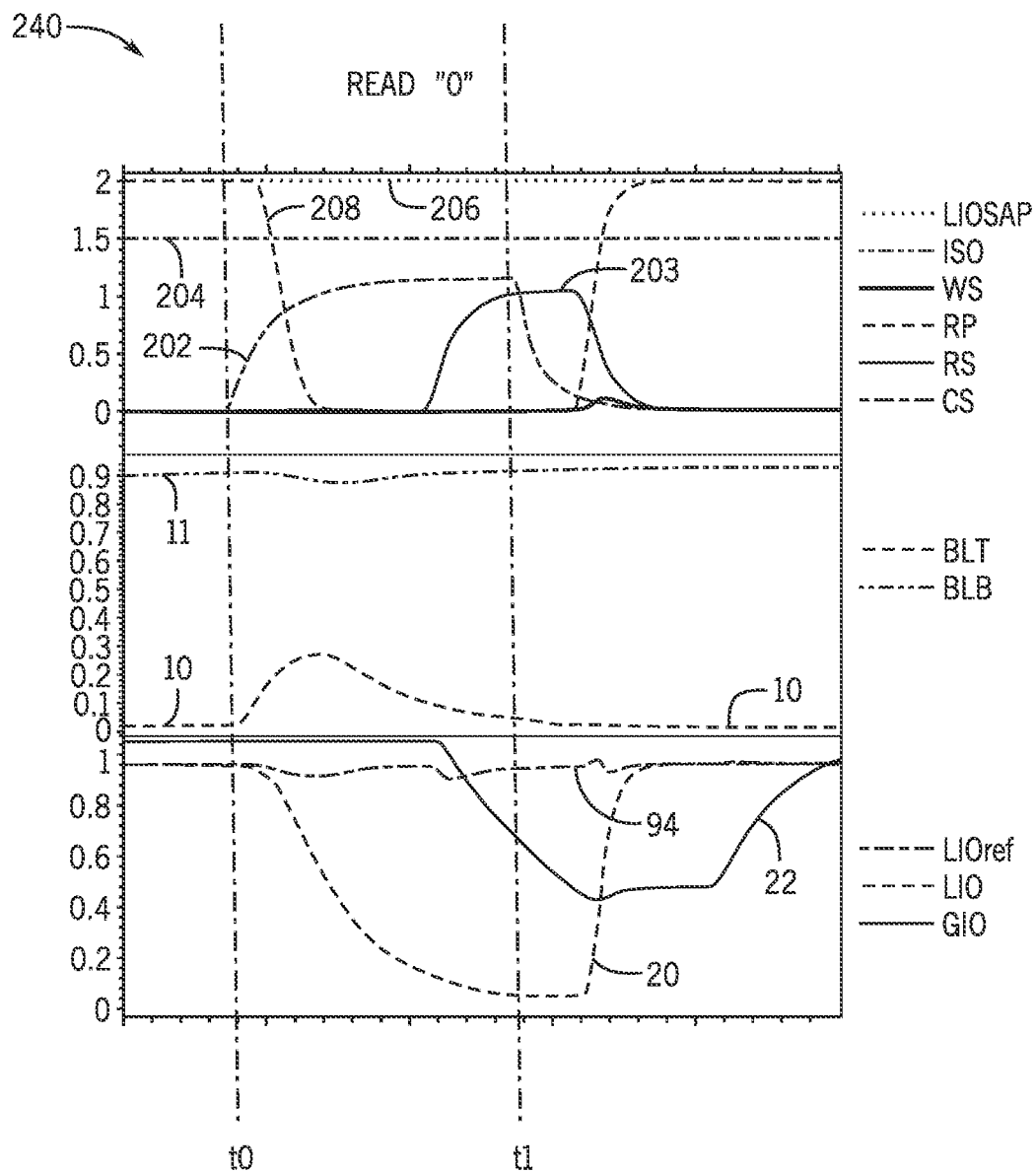
FIG. 8 is a graph illustrating an example logic low read operation of the semiconductor device of FIG. 1, according to an embodiment of the disclosure.
Figure 9:
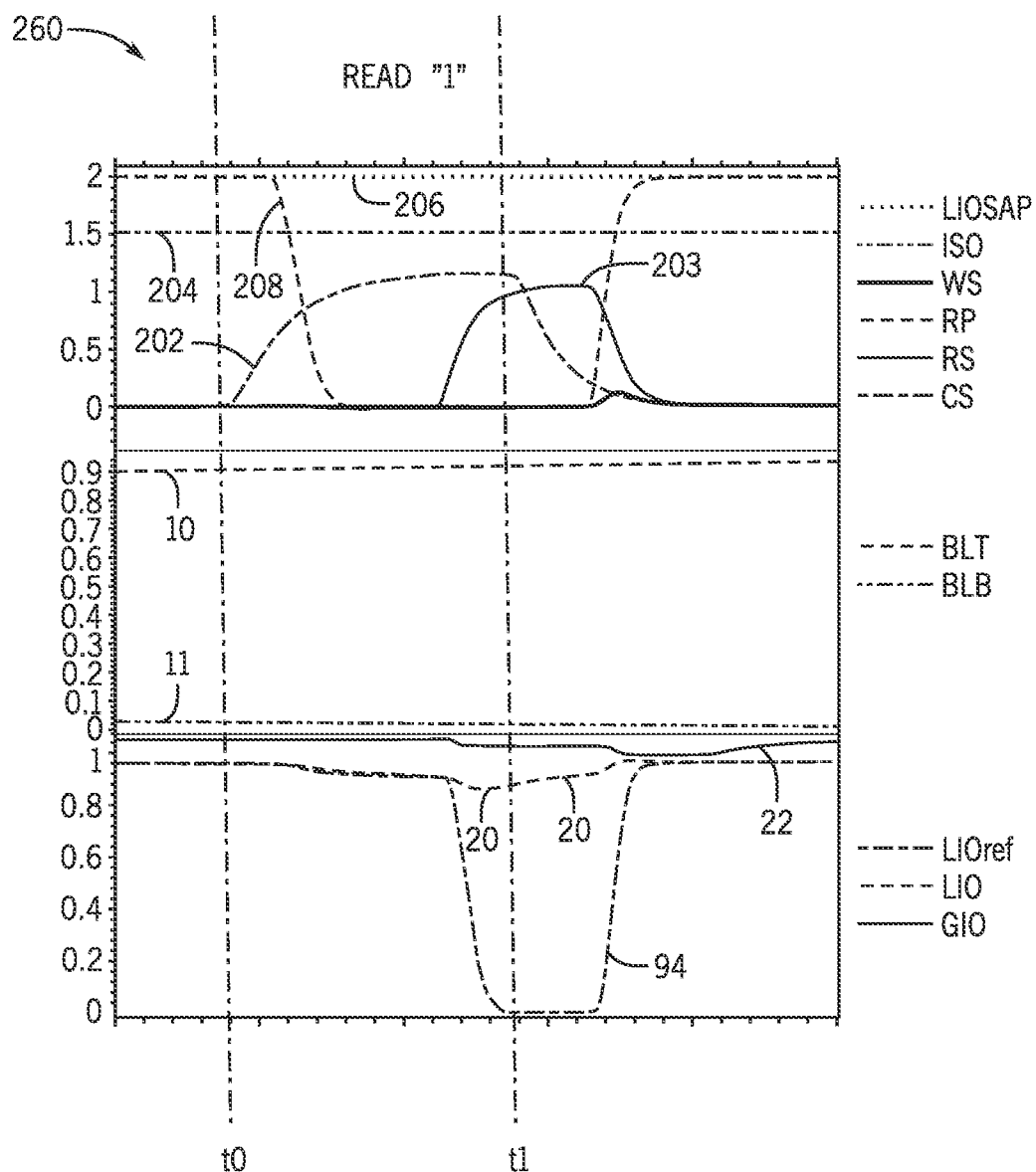
FIG. 9 is a graph illustrating an example logic high read operation of the semiconductor device of FIG. 1, according to an embodiment of the disclosure.

With the foregoing in mind, FIGS. 8 and 9 illustrate control signals received by the SAMP 18b during read operations. FIG. 8 illustrates a graph 240 during a read 0 operation where a low logic level is read out from an associated MC 12 coupled to the BLT 10. The graph 240 illustrates an initial time t=t0 when a read operation begins. The CS signal 202 rises to an active level which couples the BLT 10 to the LIO 20. For example, the voltage of the CS signal 202 may be approximately 1.16V. As such, the voltage on the LIO 20 begins to fall. The RP signal 208 may be driven to a low level (e.g., to deactivate the transistors 124 and 126 and de-couple the LIO 20 and the LIOref 94 from the voltage VARY) and the LIOSAP signal 206 rises to an active level to activate transistor 136. The switching of various signals may cause the voltage on BLT 10 to slightly rise as it is coupled to a higher voltage along the LIO 20 (even as the voltage along LIO 20 falls).

At time t=t1, the RS signal 203 may become active to activate the transistors 138 and 140. The voltage on LIOref 94 may remain at a logic high and the voltage of the CS signal 202 may fall. The voltage along the LIOref 94 activates transistor 134, which in turn couples GIO 22 to the ground (via the transistor 140). This causes the voltage on GIO 22 to fall, which may be read by the RW gap 68 as a logic low (e.g., the value read out from the associated MC 12 coupled to the BLT 10).

FIG. 9 illustrates a graph 260 during a read 1 operation where a logic high is read out from the associated MC 12 coupled to the BLT 10. Based on the control scheme, the graph 260 is substantially similar to the graph 240, except the voltages on the BLT 10 and the BLB 11, as well as the voltages on the LIOref 94, the GIO, and the LIO 20.

At time t=t0, the CS signal 202 may rise to active levels, while the RP signal 208 falls to a low logic level. The voltage on BLT 10 may be at a logic high as the MC 12 coupled to the BLT 10 is reading out a high value. Accordingly, the voltage on the LIO 20 may also remain high.

At time t=t1, the RS signal 203 rises to a logic high level, which powers the inverter formed by the transistors 130 and 132. This causes the voltage on the LIOref 94 to fall since the input voltage to the inverter is high. Since the voltage on the LIOref 94 is low, the transistor 134 remains inactive and the voltage on the GIO 22 remains high. The RW gap 68 may read the high voltage along the GIO 22 as a logic high (e.g., the value read out from the associated MC 12 coupled to the BLT 10).

Figure 10:
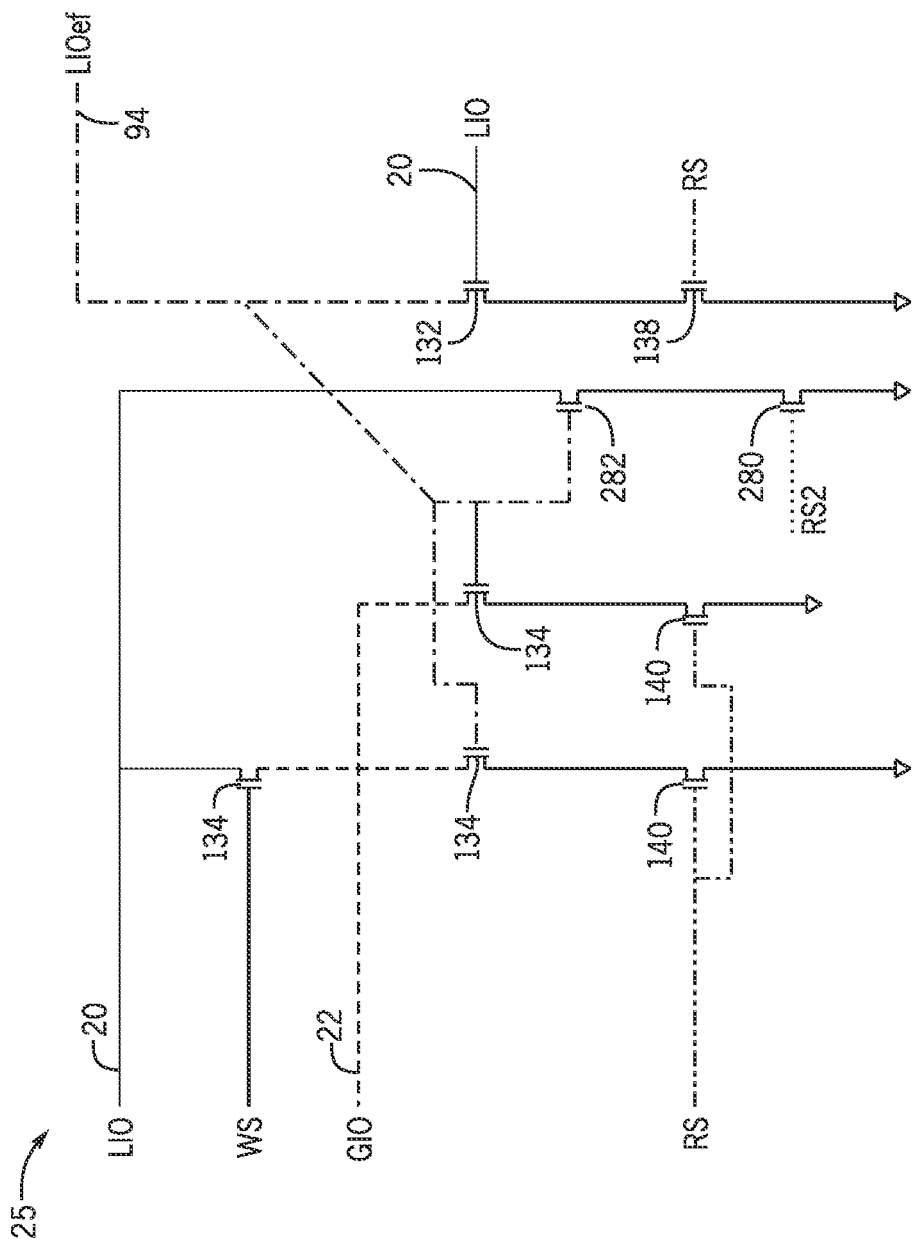
FIG. 10 is a circuit diagram of a read/write gap of the semiconductor device of FIG. 1, according to an embodiment of the disclosure.

FIG. 10 is a circuit diagram of an alternative embodiment of the RW gap 68. The circuit diagram of the RW gap 68 may be substantially similar to the circuit diagram of the RW gap 68 described with respect to FIG. 5. For example, the RW gap 68 described with respect to FIG. 10 may also include the transistors 132, 140, 134, and 142. In the illustrated example, the RW gap 68 may also include two transistors 280 and 282 to improve the read operations. For example, the transistor 282 may have a node coupled to the LIO 20, a node coupled to the ground (via transistor 280), and a gate coupled to the LIOref 94, and the transistor 280 may have a node coupled to LIO 20 (via transistor 282), a node coupled to the ground, and a gate coupled to a second read select (RS2) signal. The transistors 280 and 282 may be n-type transistors and may be cross coupled between the LIO 20 and the LIOref 94.

The control scheme for the RW gap 68 may include a second read select (RS2) signal. The RS2 signal may be a delayed signal following the RS signal 203 and may control operation of the transistors 280 and 282. For example, the RS2 signal may be pulsed on after the RS signal. During a read 0 operation, the transistors 280 and 282 may couple the LIO 20 to the ground and the voltage on the LIOref 94 may remain high. By adding additional feedback, the transistors 280 and 282 may improve a speed of the read 0 operation.

Figure 11:
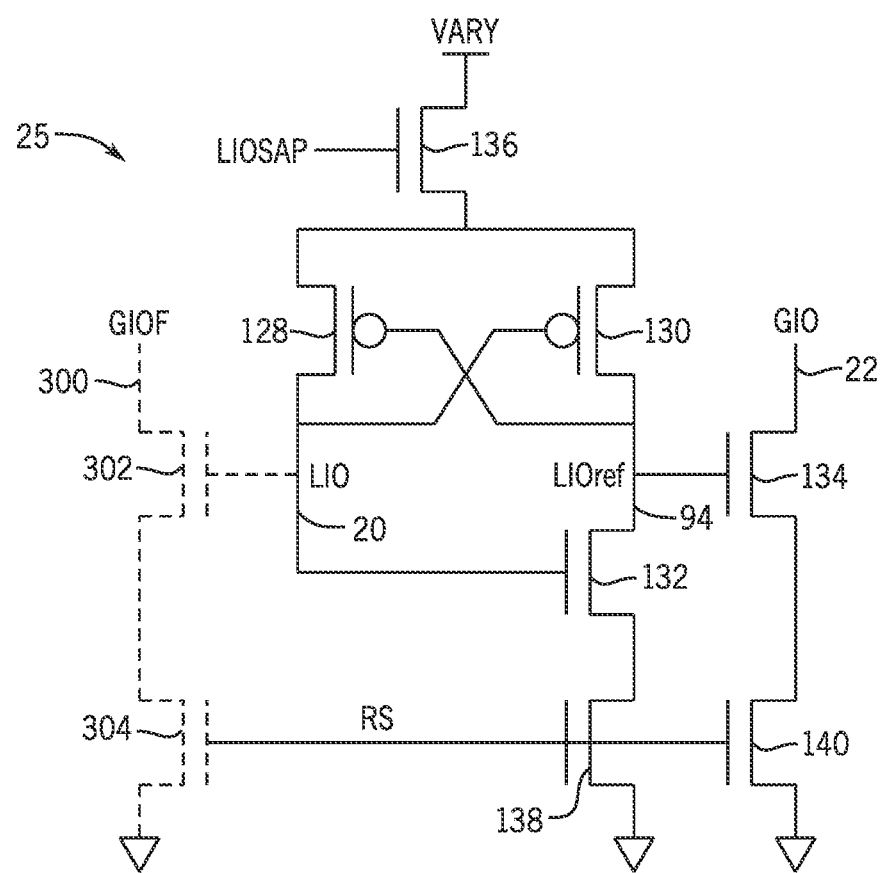
FIG. 11 is a circuit diagram of a read/write gap and a portion of a minigap of the semiconductor device of FIG. 1 implementing a differential global input/output scheme, according to an embodiment of the disclosure.

In an embodiment, a double-ended architecture may be used for the GIO 22. As such, the RW gap 68 and/or the minigap 70 may be coupled to a complimentary GIO (GIOf) line 300. FIG. 11 is a circuit diagram of the RW gap 68 and a portion of the minigap 70 including the GIOf 300 to implement a differential GIO scheme. The RW gap 68 and the portion of the minigap 70 may include many of the same components as the RW gap 68 and the minigap 70 described with respect to FIG. 5. For example, the portion of the minigap 70 may include the transistor 128, 130, and 136 and the RW gap 68 may include the transistor 132, 134, 138, and 140. To support the double-ended architecture, the RW gap 68 and the portion of the minigap 70 may include two transistors coupled to the GIOf 300. For example, a transistor 302 may have a node coupled to the GIOf 300, a node coupled to a transistor 304, and a gate coupled to the LIO 20. The transistor 304 have a node coupled to the transistor 304, a node coupled to the ground, and a gate coupled to the RS signal.

In the double-ended architecture (e.g., differential GIO scheme), the precharge for LIO 20 may be lower than the LIO 20 precharge for the single-ended architecture. Based on speed requirements and performance of the semiconductor device 2, flexibility in adjusting the LIO precharge and LIOref precharge may be achieved. For example, the LIO precharge may be equivalent to the voltage VBLP, which may be half of the voltage VARY. Lowering the precharge voltage to VBLP may require an elevated CS voltage from the column decoder 16. For example, LIO precharge to the voltage VBLP in combination with elevated CS voltage for both read and write operations may be beneficial to improve performance of the semiconductor device 2.

The relative timing of the CS signal and the ISO signal may be important for a write operation. Minimizing timing variation between the two signals may reduce or eliminate timing variation across the memory cell array 6 and/or the semiconductor device 2. As such, matching a metal routing in the layout for the control signals (e.g., CS signal, ISO signal) may minimize timing variation across the memory cell array 6.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. An apparatus comprising:
    a sense amplifier with a single column select (CS) transistor;
    a local input/output (LIO) line selectively couplable to a first bit line through the single CS transistor; and
    a read/write (RW) gap comprising a first transistor and a second transistor, wherein a gate of the first transistor is configured to receive a read select (RS) signal and wherein the first transistor is couplable to a complimentary local input/output (LIOref) line, and wherein a gate of the second transistor is configured to receive the RS signal and couplable to a global input/output (GIO) line.

2. The apparatus of claim 1, wherein the first transistor is configured to pull down a voltage on the LIOref line and the second transistor is configured to pull down a voltage on the GIO line during a read operation.

3. The apparatus of claim 1, wherein the LIO line is configured to be precharged to a voltage in the range of 0.90-1.00V.

4. The apparatus of claim 3, wherein the LIOref line is configured to be precharged to a voltage in the range of 0.90-1.00V prior to a read operation.

5. The apparatus of claim 1, wherein each of the LIO line and the LIOref line is configured to be precharged to a system level voltage VARY.

6. The apparatus of claim 1, wherein the RW gap comprises a third transistor and a fourth transistor configured to receive to a second read select (RS) signal, wherein the second RS signal occurs after the RS signal.

7. The apparatus of claim 1, wherein the single CS transistor is configured to receive a column select (CS) signal prior to a read operation or a write operation.

8. The apparatus of claim 7, wherein a voltage of the CS signal for the write operation is higher than a voltage of the CS signal for the read operation.

9. The apparatus of claim 7, wherein the sense amplifier comprises two isolation transistors configured to receive an isolation (ISO) signal, wherein the ISO signal is configured to pulse off prior to the CS signal and pulse on prior to the CS signal pulsing off.

10. The apparatus of claim 1, comprising a minigap comprising a third transistor couplable to the LIO line and a fourth transistor couplable to the LIOref line, wherein the third transistor and the fourth transistor cross couple between the LIO line and the LIOref line.

11. The apparatus of claim 10, wherein the fourth transistor is configured to pull up a voltage on the LIO line during a read operation.

12. The apparatus of claim 1, comprising a complimentary global input/output (GIOf) line couplable to the RW gap, and wherein the LIO line is configured to be precharged to a voltage in the range of 0.40-0.55V.

13. An apparatus comprising:
a sense amplifier with a single column select (CS) transistor;
a local input/output (LIO) line selectively couplable to a first bit line through the single CS transistor; and
a minigap comprising a first transistor, a second transistor, and a third transistor, wherein a gate of the first transistor is configured to provide a system voltage VARY and the first transistor is selectively couplable to the LIO line and a complimentary LIO (LIOref) line, wherein a gate of the second transistor is coupled to the LIO line, and wherein a gate of the third transistor is coupled to the LIOref line.

14. The apparatus of claim 13, wherein the third transistor is configured to pull up a voltage on the LIOref line during a read operation.

15. The apparatus of claim 13, wherein the first transistor is configured to be inactive during a write operation, and wherein the single CS transistor is configured to receive a voltage during the write operation that is higher than a voltage during a read operation.

16. The apparatus of claim 13, wherein the first transistor is configured to precharge the LIO line and the LIOref line to the system voltage VARY prior to a read operation.

17. The apparatus of claim 13, wherein the minigap comprises a fourth transistor coupled to a voltage VBLP and configured to precharge the LIO line to the voltage VBLP during a read operation or during a write operation.

18. An apparatus comprising:
a sense amplifier with one column select (CS) transistor;
a local input/output (LIO) line selectively couplable to a first bit line through the one CS transistor;
a read/write (RW) gap comprising a first transistor couplable to the LIO line and a complimentary local input/output (LIOref) line and a second transistor couplable to the LIOref line and a global input/output (GIO) line; and
a minigap comprising a third transistor couplable to an internal voltage VARY and a fourth transistor couplable to an internal voltage VBLP.

19. The apparatus of claim 18, wherein the first transistor is configured to adjust a voltage pulldown on the LIOref line and the second transistor is configured to adjust a voltage pulldown of the GIO line during a read operation.

20. The apparatus of claim 18, wherein the third transistor is configured to be inactive during a write operation to prevent a voltage on the LIOref line from transferring to the GIO line.

21. The apparatus of claim 18, wherein the minigap comprises a fifth transistor and a sixth transistor configured to cross couple the LIOref line and the LIO line, wherein the fifth transistor is configured to pull up a voltage on the LIOref line during a read operation.

* * * * *